United States Patent [19]
Verhaverbeke

[11] Patent Number: 6,032,682
[45] Date of Patent: *Mar. 7, 2000

[54] METHOD FOR SULFURIC ACID RESIST STRIPPING

[75] Inventor: Steven Verhaverbeke, Radnor, Pa.

[73] Assignee: CFMT, Inc, Wilmington, Del.

[ * ] Notice: This patent issued on a continued prosecution application filed under 37 CFR 1.53(d), and is subject to the twenty year patent term provisions of 35 U.S.C. 154(a)(2).

[21] Appl. No.: 08/881,267

[22] Filed: Jun. 24, 1997

Related U.S. Application Data

[60] Provisional application No. 60/020,397, Jun. 25, 1996.
[51] Int. Cl.$^7$ .............................. B08B 6/00; B44C 1/22; H01L 21/302
[52] U.S. Cl. .............................. 134/1.3; 216/83; 438/745
[58] Field of Search .............................. 134/1.3; 216/83; 438/745

[56] References Cited

U.S. PATENT DOCUMENTS

| | | | |
|---|---|---|---|
| 3,869,313 | 3/1975 | Jones et al. | 134/73 |
| 3,900,337 | 8/1975 | Beck et al. | 134/3 |
| 4,837,129 | 6/1989 | Frisch et al. | 430/319 |
| 5,000,795 | 3/1991 | Chung et al. | 134/37 |
| 5,114,529 | 5/1992 | Masuyama et al. | 156/643 |
| 5,212,050 | 5/1993 | Mier et al. | 430/320 |
| 5,364,510 | 11/1994 | Caprio et al. | 204/153.1 |
| 5,631,178 | 5/1997 | Vogel et al. | 438/200 |
| 5,653,045 | 8/1997 | Ferrell | 34/341 |

FOREIGN PATENT DOCUMENTS

| | | |
|---|---|---|
| 840112 | 7/1976 | Belgium . |
| 50-101107 | 8/1975 | Japan . |
| 56-046535 | 4/1981 | Japan . |
| 4-065829 | 3/1992 | Japan . |
| 9-064005 | 3/1997 | Japan . |

OTHER PUBLICATIONS

L.H. Haplan and B.K. Bergin, Residues from Wet Processing of Positive Resists, *J. Electrochem. Soc.*, 127, 386, 1980.

*Primary Examiner*—Benjamin Utech
*Assistant Examiner*—George Goudreau
*Attorney, Agent, or Firm*—Woodcock Washburn Kurtz Mackiewicz and Norris LLP

[57] ABSTRACT

The present invention provides methods for efficiently cleaning semiconductor wafers, and particularly for removing photoresist material from the surfaces of semiconductor wafers, using a mixture of sulfuric acid and hydrogen peroxide. In accordance with the present invention, an initial sulfuric acid-based photoresist stripping bath, either being pure sulfuric acid or a sulfuric acid:hydrogen peroxide mixture with a ratio of at least 15:0.3, based on the anhydrous chemical substances, is prepared for processing an initial batch of wafers. During the processing of the semiconductor wafers, hydrogen peroxide is added to the bath solution at a controlled rate of between about 0.015–1.5 g $H_2O_2$ (anhydrous basis)/min./liter of photoresist bath solution. In such a way, the conversion of hydrogen peroxide to Caro's acid is optimized resulting in an extended bath life and conservation of hydrogen peroxide.

14 Claims, 1 Drawing Sheet

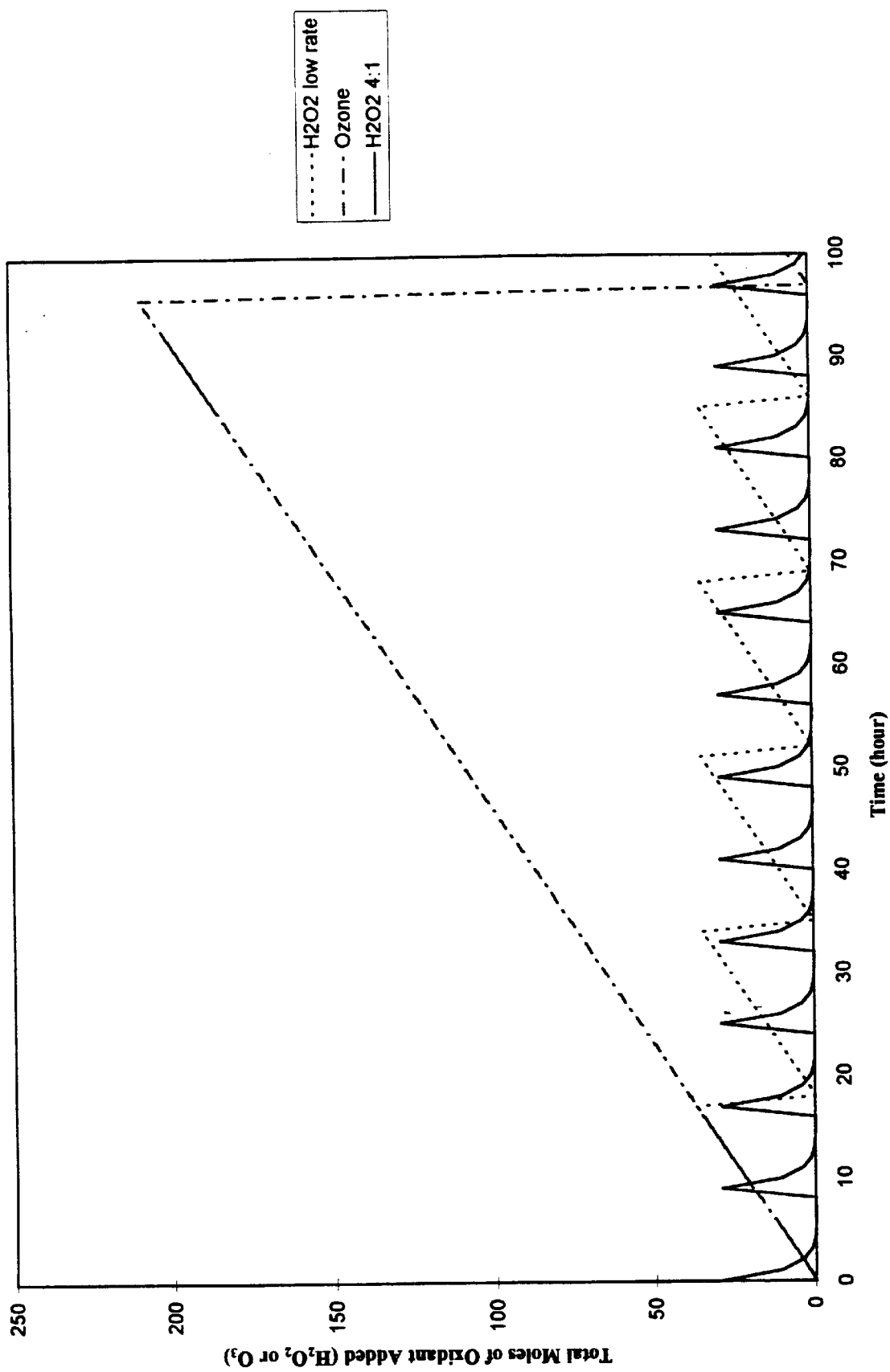

METHOD FOR SULFURIC ACID RESIST STRIPPING

CROSS-REFERENCE TO RELATED APPLICATIONS

This application claims the benefit under 35 U.S.C. §119 (e) of U.S. Provisional Application Ser. No. 60/020,397, filed Jun. 25, 1996.

FIELD OF THE INVENTION

The present invention relates to the field of cleaning semiconductor wafers with a solution of sulfuric acid and hydrogen peroxide and control of the process used for stripping photoresist material from the surface of a semiconductor wafer. More particularly, the present invention relates to the controlled addition of hydrogen peroxide to a photoresist chemical bath that contains a relatively high ratio of sulfuric acid to hydrogen peroxide to extend the useful life of the chemical bath.

BACKGROUND OF THE INVENTION

Front-end resist stripping historically has been completed with inorganic oxidizing mixtures. Inorganic acids such as sulfuric acid ($H_2SO_4$), nitric acid ($HNO_3$), chromic acid ($H_2CrO_4$), phosphoric acid ($H_3PO_4$) and hydrogen peroxide ($H_2O_2$) have been used since the early days of semiconductor manufacturing to strip resist layers as discussed in L. H. Haplan and B. K. Bergin, *Residues from Wet Processing of Positive Resists, J. Electrochem.* Soc., 127, 386, 1980. Even today, all of these chemicals can be found in use for resist stripping. Sulfuric/chromic and sulfuric/nitric mixtures are typically used at 100° C. Fuming nitric, also still in use today, is typically used at room temperature. Some of these inorganic oxidizing mixtures can also be used in the back-end of line of wafer processing since many of the concentrated acids are not-corrosive to metals if the water concentration is low.

The use of photoresist chemical baths that contain sulfuric acid and hydrogen peroxide is known as described in U.S. Pat. No. 3,900,337 to Beck, et al. This patent describes the use of a bath containing a relatively low concentration of hydrogen peroxide with respect to the concentration of sulfuric acid. It is stated that the chemical bath should contain a ratio of sulfuric acid:hydrogen peroxide of greater than 15:1, and generally between about 17:1 to about 35:1. It is noted that a combination of two different baths can be used to clean wafers where the first bath contains a higher ratio than the second bath.

Since 1980, Piranha wet baths, composed of sulfuric acid mixed with hydrogen peroxide have gained popularity, and have become the most common method of post-ash resist stripping. Today, the bulk of the resist is usually removed by ashing the photoresist. Therefore, wet photoresist stripping is mainly limited to post-ash resist stripping. Both post-ash resist stripping and bulk photoresist stripping are considered here.

As noted in U.S. Pat. No. 3,900,337, when mixing hydrogen peroxide and sulfuric acid, there is formed "Caro's acid" ($H_2SO_5$). Caro's acid is the common name for peroxymonosulfuric acid (i.e. monopersulfuric acid). The chemical structure is shown below:

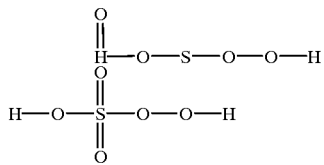

Caro's acid has an oxidation state of +8 and is the active species in Piranha baths. Concentrated sulfuric acid is an excellent solvent for Caro's acid, whereas the acid decomposes in water. The stripping solution originally developed for Piranha baths is created by a mixture of concentrated $H_2SO_4$ with highly concentrated (85–90%) hydrogen peroxide. The reaction that occurs upon mixing proceeds as follows:

$$H_2O_2 + H_2SO_4 \Longleftrightarrow HO-(SO_2)-O-OH + H_2O \qquad [1]$$

Reaction [1] shows that $H_2O$ is produced in the reaction of $H_2O_2$ and $H_2SO_4$ and therefore, the presence of water will actually shift the reaction towards the reactants, minimizing the production of Caro's acid. While reaction [1] is not highly exothermic, substantial heat can be developed during the dilution of sulfuric acid with the water that is typically contained in hydrogen peroxide, as well as the water formed by the reaction. Since $H_2SO_5$ is not particularly heat-stable, excessive amounts of water in the hydrogen peroxide can lead to thermal decomposition of the $H_2SO_5$. Consequently, the production of Caro's acid in Piranha baths is optimized by using hydrogen peroxide in a highly concentrated form (85–90%).

Caro's acid has several major advantages as a photoresist stripper: it can be used at room temperature, and at room temperature and in the absence of water, it is non-corrosive. However, highly concentrated hydrogen peroxide is extremely dangerous; it is potentially detonatable (upon admixture of only small amounts of organics) and can also present a serious fire hazard. For improperly clothed personnel, concentrated $H_2O_2$ can cause severe chemical burns.

As a result of safety issues associated with concentrated $H_2O_2$, the semiconductor industry has generally adopted the use of "laboratory concentrated" $H_2O_2$ (approximately 31% by weight) for wet processing, including Piranha stripping. The use of this dilute $H_2O_2$ in a Piranha bath, however, leads to overheating upon mixing. Additionally, the excess water found in 31% by weight $H_2O_2$ shifts the equilibrium in reaction [1] away from the production of $H_2SO_5$. Therefore, the use of 31% by weight $H_2O_2$ in a Piranha bath does not produce Caro's acid to any significant concentration. As a result, the mixture of $H_2SO_4$ and $H_2O_2$ has to be heated to very high temperatures in order to be effective in resist stripping. Typically, temperatures as high as 120° C. are used. Such high temperatures help to drive the water off. Solution dilutions are generally about 4:1, 4 parts $H_2SO_4$ to 1 part $H_2O_2$ ($H_2O_2$ being at 31% strength). As a result of the instability of this solution, hydrogen peroxide has to be added continuously, thereby adding 69% water with every spiking, thus making the solution even more instable. Consequently, frequent exchange of the Piranha baths are required.

Recently, ozone has been introduced as an alternative to hydrogen peroxide in Piranha baths. From a consumables point of view, replacing $H_2O_2$ by $O_3$ is very attractive as $H_2O_2$ is one of the most expensive chemicals, whereas $O_3$ can be generated in-situ from $O_2$ gas or even from air.

Ozone in Sulfuric Acid

Although the solubility of ozone in deionized water (DI-water) is known to be very low (about 10 ppm at 25° C.), ozone solubility in sulfuric acid is not a limiting factor; rather, ozone reacts with the sulfuric acid. When ozone is sparged in sulfuric acid, a reaction occurs forming dipersulfuric acid or peroxydisulfuric acid, $H_2S_2O_8$ (oxidation state +7). The chemical structure of dipersulfuric acid is:

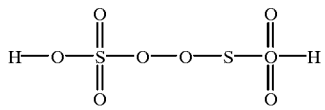

This reaction proceeds as follows (2):

$$2HSO_4^- + O_3 \Longleftrightarrow O_2 + H_2O + S_2O_8^{-2} \qquad [2]$$

Note that the reaction [2] is written with sulfuric acid singly dissociated and $H_2S_2O_8$ completely dissociated. These are the dominant forms of both species in acid solutions.

Dipersulphuric acid is a solid and very soluble in sulfuric acid.

Oxidation Power

The oxidation potential indicates the oxidation power of one molecule. Ozone has an oxidation potential of 2.07 V (measured versus the Normal Hydrogen Electrode) whereas $H_2O_2$ has an oxidation potential of 1.776 V. The oxidation potential of $H_2S_5O_8$ is 2 V. Obviously, both concentration and oxidation power per molecule must be considered for resist stripping.

Resist Stripping Species

During resist stripping, free radicals are formed from $H_2SO_5$ and $H_2S_2O_8$, as follows ($H_2S_2O_8$ is written as being undissociated, but, usually, $H_2S_2O_8$ will be completely dissociated into $2H^+$ and $S_2O_8^{31-}$):

$$HO-O-SO_2-OH \rightarrow {}^*OH + {}^*OSO_2-OH \qquad [3]$$

and $$HO-SO_2-O-O-SO_2-OH \rightarrow 2{}^*OSO_2-OH \qquad [4]$$

The $^*OSO_2$—OH and the $^*OH$ radicals are active in photoresist stripping:

$$RH + {}^*OSO_2-OH \rightarrow R^* \text{ (alkyl radical)} + H_2SO_4 \qquad [5]$$

$$R-CH_2-R + {}^*OH \rightarrow R-OH + {}^*CH_2-R \qquad [6]$$

which further react to form:

$$R^* + O^* \rightarrow CO, CO_2 \qquad [7]$$

$$^*CH_2-R + O^* \rightarrow CO, CO_2 \qquad [8]$$

where $O^*$ means any oxidizing species in the solution, such as, $$H_2O_2 \rightarrow H_2O + O^* \qquad [9]$$

or $$O_3 \rightarrow O_2 + O^* \qquad [10]$$

or $$H_2SO_5 \rightarrow H_2SO_4 + O^* \qquad [11]$$

or $$S_2O_8^= + H_2O \rightarrow 2HSO_4^- + O^* \qquad [12]$$

By combining reactions [1], [3], [6] and [9] the reaction of organics with $H_2O_2$ is obtained:

$$-CH_2- + 3H_2O_2 \rightarrow 4H_2O + CO_2 \qquad [13]$$

Similarly, for the organic reaction with $H_2SO_5$ (combining reactions [1], [3], [6] and [11]):

$$-CH_2- + 3H_2SO_5 \rightarrow 3H_2SO_4 + CO_2 + H_2O \qquad [14]$$

By combining reactions [2], [4], [5] and [10], one obtains for the total reaction with $O_3$:

$$-CH_2- + 3O_3 \rightarrow 3O_2 + CO_2 + H_2O \qquad [15]$$

or by combining reactions [2], [4], [5] and [12], one obtains for the reaction with $S_2O_8^-$ $$-CH_2^- + 3S_2O_8^= + 2H_2O \rightarrow 6HSO_4^- + CO_2 \qquad [16]$$

The oxidation capacity of resist stripping solutions can be compared in terms of equivalent formic acid oxidation capacity. However, throughout herein only the oxidation capacity in terms of equivalent —$CH_2$— groups oxidation capacity will be considered.

Beyond the various chemical compounds that are used in baths for photoresist stripping, there are various systems that have been developed for monitoring the concentration of the individual species within the baths or for adding individual species into the baths. For instance, in U.S. Pat. No. 3,869,313 to Jones et al., there is disclosed an apparatus with related equipment for maintaining the composition of the liquid bath. Photoresist stripping baths are described as including sulfuric acid-hydrogen peroxide mixtures containing 60–99.95 wt. % sulfuric acid, 0.05–25% wt. hydrogen peroxide, and 0–39.95% wt. water. During the processing of semi-conductor wafers, it is taught to supply small amounts of fresh sulfuric acid and hydrogen peroxide to the processing tank to maintain the composition of the sulfuric acid-hydrogen peroxide mixture present in the tank. This patent does not describe the rates of addition of any make-up chemicals other than to keep the concentration of the individual species within predetermined limits.

Another system for injecting chemical species into a semiconductor wafer cleaning apparatus is set forth in U.S. Pat. No. 5,000,795 to Chung et al. This patent describes the use of a piping system within the wafer bath chamber to deliver an added chemical species through a plurality of jets located within the piping system. Again, this patent fails to describe the rates of addition for any particular chemical species.

A further system for monitoring the concentration of a chemical species, such as hydrogen peroxide and/or sulfuric acid, in a photoresist chemical bath is shown in U.S. Pat. No. 5,346,510 to Caprio. In this patent, the system can monitor the concentration of the chemical species and in response thereto add fresh reagent. This patent, like the Chung et al. and the Jones et al. patents, fails to describe the rates of addition for any particular chemical species, but rather suggests adding the reagents to maintain a predetermined, constant concentration.

There exists a need in the industry of cleaning semiconductor wafers to remove photoresist material to develop a system and a method for its use wherein the cleaning power of the bath solution is optimized throughout its life.

SUMMARY OF THE INVENTION

The present invention provides an improved method for stripping photoresist material from the surfaces of semiconductor wafers and for cleaning semiconductor wafers in a general with a solution of sulfuric acid and hydrogen peroxide. Although solutions of sulfuric acid and hydrogen peroxide were originally used for photoresist stripping, such solutions are also used for general clean-up of semiconductor wafers. Efficiencies in raw material costs and solution, or bath, life are greatly improved by practicing the methods of the present invention. The efficiency of the hydrogen peroxide reagent, which is the more expensive chemical species, is greatly enhanced by the methods of the present invention. In accordance with the present invention, an initial bath solution is prepared containing pure sulfuric acid or a mixture of sulfuric acid and hydrogen peroxide having a relatively high ratio of sulfuric acid to hydrogen peroxide. During the processing of the semiconductor wafers, limited, controlled additions of hydrogen peroxide are made to the bath solution to efficiently convert the hydrogen peroxide to Caro's acid, which is the preferred active species in the bath solution to remove photoresist material or other unwanted material from the surfaces of the semiconductor wafers.

In one embodiment of the present invention, a method for cleaning unwanted material from the surface of a semiconductor wafer is practiced by preparing an initial bath solution that consists essentially of sulfuric acid ($H_2SO_4$), and preferably contains only pure sulfuric acid (preferably at least 95% wt. concentration). Alternatively, the initial bath solution can be prepared by mixing sulfuric acid and hydrogen peroxide ($H_2O_2$), where the ratio of sulfuric acid to hydrogen peroxide is greater than 15:0.3, referring to volume quantities of the anhydrous chemical substances. Hydrogen peroxide is added to the initial bath solution to prepare a processing bath solution, the rate of addition of hydrogen peroxide being from about 0.015 to about 1.5 g $H_2O_2$/min./l of the processing bath solution. The semiconductor wafers are processed through the processing bath solution by contacting the surfaces of the semiconductor wafers with the bath solution. The addition of the hydrogen peroxide at the stated rate is maintained during the processing of the semiconductor wafers. Typically, the wafers are processed through the processing bath solution in a batchwise fashion and the hydrogen peroxide is added at the stated rate throughout this processing. A first batch of semiconductor wafers can be contacted with the initial bath solution prior to the commencement of the addition of the hydrogen peroxide at the stated rate. During the processing of the semiconductor wafers, which can last up to about 20 hours for a typical bath life and include a multitude of batches of wafers, the limited, controlled amounts of hydrogen peroxide are maintained.

The addition of hydrogen peroxide in the controlled fashion greatly improves the efficiency of the overall cleaning process. The hydrogen peroxide reacts with the sulfuric acid to produce Caro's acid ($H_2SO_5$), which is believed to be the principle active species for oxidizing unwanted, waste, organic material, such as the organic material in photoresist waste. By controlling the introduction rate of the hydrogen peroxide, the efficiency of the production of Caro's acid is increased. That is, more of the added hydrogen peroxide is converted to Caro's acid than if a large quantity of hydrogen peroxide were added to the sulfuric acid at the beginning of the process, which is typical in the preparation of a 4:1 sulfuric acid:hydrogen peroxide bath commonly used to clean wafers.

The present invention takes advantage of the fact that for processing most wafers a high concentration of oxidation power in the bath solution is not necessary. For instance, if a 20 liter bath size is used as an example, in a 4:1 $H_2SO_4$:$H_2O_2$ solution, 4 liters of $H_2O_2$ is used initially, which results in a significant production of Caro's acid that is well in excess of that needed to treat the first batch of wafers. However, the efficiency of conversion of the hydrogen peroxide to Caro's acid is not great. In contrast, by adding reduced amounts of hydrogen peroxide during the entire processing lifetime of a cleaning or stripping bath solution, sufficient quantities of Caro's acid are produced to clean or to strip photoresist material from the wafers, and the efficiency of the conversion of the hydrogen peroxide is improved. Thus, the present invention takes advantage of the low requisite oxidizing power of the cleaning or stripping bath and the improved efficiencies of conversion at low hydrogen peroxide addition rates to improve the efficiency of the overall process.

BRIEF DESCRIPTION OF THE FIGURE

The FIGURE is a graph representing the stripping bath life for three case studies, each using a 20 liter bath volume. In the first case, an 8 hour bath life is assumed for a conventional stripping bath prepared with an initial ratio of sulfuric acid:hydrogen peroxide of 4:1. In the second case, a 17 hour bath life is assumed for a stripping bath prepared with pure sulfuric acid to which hydrogen peroxide is added at a rate of 3.97 ml/min (for a 20 liter total bath volume). In the third case, a 4 day bath life is assumed for a stripping bath prepared with pure sulfuric acid to which ozone is sparged at an injection rate of 1.74 g/min. The short bath life for the first case is due to the rapid decrease in active peroxysulfuric acid caused by the high temperature and high water concentration.

DETAILED DESCRIPTION OF THE INVENTION

The present invention provides improved methods for the general cleaning of the surfaces of semiconductor wafers, and in particular, for removing photoresist material or layers from the surfaces of semiconductor wafers. In accordance with the present invention, the semiconductor wafers are processed in a processing bath that contains, at least, sulfuric acid ($H_2SO_4$) and hydrogen peroxide ($H_2O_2$). The combination of these two species produces Caro's acid ($H_2SO_5$), which is believed to be the active species in the processing bath. In the present invention, the initial concentration of hydrogen peroxide in the processing bath is relatively low, but sufficient to produce an effective amount of oxidation power in the bath to effectively clean the waste material, such as the photoresist waste, from the surfaces of the semiconductor wafers. During the processing of additional semiconductor wafers in the processing bath, the production of Caro's acid is optimized by adding limited quantities of hydrogen peroxide to the processing bath. In such a way, there is an improvement in the efficiency of the conversion of hydrogen peroxide to Caro's acid. This improved efficiency translates into extended bath life in comparison to methods where the hydrogen peroxide is added to the processing bath in relatively larger quantities from the start of using the processing bath.

Resist Stripping Species Concentration

By way of background, a conventional photoresist stripping bath contains about 20 liters (l) of a Piranha bath solution consisting of 4 parts sulfuric acid: 1 part 31%-by-weight hydrogen peroxide (i.e., for a 20 l bath or vessel, there are 4 liters of $H_2O_2$). Thus, this bath solution contains 1.24 kg or 36.5 moles of hydrogen peroxide. According to reaction [13], this quantity of $H_2O_2$ corresponds to an equivalent oxidation capacity of 12.16 moles (or 170 g) of —$CH_2$—, since 3 moles of hydrogen peroxide are needed for the oxidation of 1 mole of —$CH_2$—.

In the case of a sulfuric acid/ozone processing system, ozone can be continuously sparged in sulfuric acid. Ozone generating units available today have outputs of the order or 1 to 2 g $O_3$/min. An ozone generation rate of 1.74 g $O_3$/minute assumed for purposes herein—this output being available on commercial units often used for their high output. This production rate corresponds to an output of 0.036 moles/min of $O_3$ or an equivalent —$CH_2$— oxidation capacity of 0.012 moles/min (according to reaction [15]). As a production rate of 1.74 g/minute of ozone, 16 hours 47 min are required to generate an equivalent amount of —$CH_2$— oxidation capacity as the 4:1 sulfuric acid/hydrogen peroxide solution for a 20 l bath or vessel. In order to reduce this time, the ozone output can be increased (installing a larger ozone generator) or the bath or vessel volume can be decreased.

Resist Loading of the Oxidation Capacity of a Stripping Solution

To design an improved photoresist stripping process, it is necessary to analyze the loading of resist material on the surfaces of the semiconductor wafers and the oxidation capacity that must be present in the species contained within the stripping bath. Clearly, a stripping bath produced from $H_2SO_4/O_3$ where the ozone is sparged into the system requires many hours before obtaining the same oxidation capacity as a 4:1 $H_2SO_4/H_2O_2$ bath. It is, however, important to calculate how much oxidation capacity is actually needed for resist stripping. Typical resist thicknesses range from 1 to 1.5 $\mu$m, and the total surface area of fifty (50) 200 mm wafers is 15700 $cm^2$. The specific gravity of resist is of the order of 1.2 g$lcm^3$. Therefore, there is between 1.89 g and 2.83 g of photoresist. However, after $O_2$ plasma ashing, the amount of resist left on a batch of 50 wafers is less than 1% of the original photoresist on the wafers (e.g., about 0.02 g). In other words, before ashing about 0.14 moles of equivalent —$CH_2$— will have to be oxidized and after ashing about 0.0014 moles of equivalent —$CH_2$— groups will need to be oxidized. The amount of oxidizers necessary to remove all the photoresist on a batch of 50 or even 100 wafers will differ tremendously whether or not ashing is completed prior to stripping.

In a stripping bath comprising a 4:1 mixture sulfuric acid/hydrogen peroxide (31% wt.), there is initially 12.16 moles of —$CH_2$— oxidation capacity present. Therefore, at 100% efficiency a 4:1 bath of sulfuric acid/hydrogen peroxide is good for 86 batches of 50 unashed wafers. However, assuming 100% efficiency is clearly unreasonable, as the baths deteriorate rapidly; 10% efficiency provides an optimistic estimate of bath life. Thus, such a bath would be good for 8.6 batches of 50 unashed wafers.

In a sulfuric acid/ozone mixture with the sparging of ozone the production of oxidizing capacity of equivalent —$CH_2$— groups is 0.012 moles/min. Thus, each batch of 50 unashed wafers will require a sparging of ozone in the sulfuric acid of 11 minutes and 40 seconds at 100% efficiency of ozone use. Obviously, 100% efficiency can never be acheived and 10% efficiency provides a conservative estimate of the process time. Therefore, one batch of unashed photoresist can be safely processed with a sulfuric acid/ozone system every 1 hour 56 min. Thus, the oxidation capacity of sulfuric acid/ozone is not enough for stripping unashed photoresist if the efficiency of ozone use is only 10% and are run more frequently than every two hours. On the other hand, after ashing less than 0.02 g of photoresist will be left on the wafer and in such a case sulfuric acid/ozone will supply ample oxidation capacity. Even with the conservative estimate of 10% efficiency of ozone reaction with sulfuric acid, every 1 min 20 s a batch of 50 ashed wafers can be processed in a sulfuric acid/ozone process vessel.

Comparison Between Ozone and Hydrogen Peroxide in Sulfuric Acid

As noted, when mixing hydrogen peroxide and sulfuric acid, "Caro's acid" is formed. Most of the "Caro's acid" generated by mixing $H_2O_2$ and $H_2SO_4$ instantly decomposes, as previously discussed from the water added with $H_2O_2$ and the generation of heat resulting from mixing dilute or laboratory grade hydrogen peroxide and sulfuric acid. Consequently, temperatures ranging from 90° C. up to 140° C. are needed to achieve a good stripping result; the most typical temperature is 120° C. The use of high temperatures further accelerates the decomposition of "Caro's acid". Additionally, $H_2O_2$ decomposes at high temperatures. Therefore, as a result of all these instabilities, hydrogen peroxide must be added continuously for effective oxidation of organic compounds. However, when hydrogen peroxide is added additional water is added (69% of the solution is water when laboratory grade $H_2O_2$ is added). Therefore, the stripping solution is continuously diluted and the oxidizing power is decreasing continuously. Eventually the whole solution contains too much water, and the resist removal process ceases to work.

The main advantage of the sulfuric acid/ozone is that ozone can be added without the addition of water. Although no water is added with the ozone, the solution does not remain water free. The reaction of ozone and sulfuric acid (reaction [2]) produces one mole of $H_2O$ for every mole of $O_3$ that reacts with the $HSO_4^-$ after injection. When a 100% efficiency is assumed for the reaction of ozone with sulfuric acid (i.e. every injected $O_3$ molecule reacts with $HSO_4^-$), then at an injection rate of 1.74 g $O_3$/min, water will be produced at a rate of 0.65 ml/min or, after 24 hours, 940 ml of water will have been formed. Therefore, $O_3$ can be injected in the sulfuric solution for at least 4 days, without generating too much water.

However, if organic material is present in the sulfuric acid, the situation is improved, since less water will be produced by the overall reaction of ozone with organic material as compared to the reaction of ozone with sulfuric acid. The entire oxidation process produces only 1 mole of $H_2O$ for every 3 moles of $O_3$ (reaction [15]). Therefore, if all the ozone is used for oxidation, only 0.22 ml/min of $H_2O$ will be formed (i.e. after 24 hours, only 312 ml of water will be formed). Some build-up of water occurs when ozone is used instead of hydrogen peroxide and therefore, even the sulfuric acid/ozone solution has a limited lifetime.

The main advantage of sulfuric/ozone is that the oxidizing power is maintained longer without degradation of performance as compared to the sulfuric/peroxide process, since less water is added. As a result of the higher concentration of sulfuric acid (there is no water initially) and the higher oxidation power of ozone versus hydrogen peroxide, the temperature of the sulfuric/ozone process can be substantially lower than in the case of the sulfuric/hydrogen peroxide process. A temperature of 85° C. has been found to be the optimum temperature for this process. The main disadvantages of the sulfuric acid/ozone process are the higher capital cost associated with the ozone generators as compared with the connection to a bulk chemical supply required for hydrogen peroxide. The consumable cost of ozone production, however, is much lower than that of hydrogen peroxide.

Continuous Sparging of Hydrogen Peroxide in Sulfuric Acid

After understanding the advantages and disadvantages of ozone versus hydrogen peroxide in sulfuric acid, a process that combines the best of both methods can be designed. The main disadvantages of the sulfuric acid/ozone are the capital cost and the limited oxidation capacity. The main disadvantages of the sulfuric acid/hydrogen peroxide bath are the instability of the solution, and the high processing temperatures required, and the high consumption of $H_2O_2$.

The oxidation capacity of a freshly mixed 4:1 sulfuric acid/hydrogen peroxide is theoretically sufficient for 86 batches of unashed wafers, which is an enormous excess. The analysis of the sulfuric acid/ozone process indicates that the amount of ozone sparged into the sulfuric acid is quite sufficient for post-ash resist cleaning. Consequently, a sulfuric acid/hydrogen peroxide process can be designed to provide the required oxidation capacity, especially for post-ashed wafers, without decomposition, and having an oxidation strength similar to the one obtained by adding ozone.

In accordance with the present invention, an optimized system for photoresist stripping with a bath containing sulfuric acid:hydrogen peroxide would continuously add small amounts of hydrogen peroxide to sulfuric acid. In order to match the oxidation capacity of the sulfuric acid/ozone process with hydrogen peroxide, 3.97 ml/min of hydrogen peroxide (31% by weight), should be added continuously to concentrated sulfuric acid similar to the 1.74 g $O_3$/min continuous sparging of the ozone. This is for a system with a 20 liter bath volume. Thus, 0.2 ml $H_2O_2$/min. is added per liter of solution to be equivalent to a sulfuric acid/ozone system.

The present invention can be used to generally clean semicondcutor wafers, but is preferably used for photoresist stripping. The methods are described herein with respect to photoresist stripping, although the same technique is followed for general cleaning applications.

The process of cleaning photoresist material from the surfaces of semiconductor wafers in accordance with the present invention is initiated by preparing a fresh, or initial, photoresist stripping bath solution. This initial bath solution can contain pure sulfuric acid or it can contain a relatively low amount of hydrogen peroxide to provide sufficient initial oxidation capacity to properly clean the first batch of semicondutor wafers. In the latter case, the initial bath solution is prepared by combining sulfuric acid with hydrogen peroxide where the ratio of sulfuric acid to hydrogen peroxide used to prepare the bath solution is greater than 15:0.3, preferably greater than 20:0.3, and more preferably greater than 25:0.3, referring to volume quantities of the anhydrous chemical substances.

After the preparation of this initial stripping bath solution, a batch of semiconductor wafers having surfaces containing photoresist material are contacted with the stripping bath solution. This contacting step is conducted using any of the various conventional techniques, e.g., immersing the wafers into the bath solution.

In accordance with the present invention, the oxidizing power of the stripping bath solution is efficiently maintained throughout the life of the bath solution by adding hydrogen peroxide to the bath solution in a controlled, limited rate. In such a way, the hydrogen peroxide is efficiently converted to Caro's acid with a minimum amount of water production. The hydrogen peroxide is added to the bath solution at a rate of 0.015 to about 1.5 g $H_2O_2$ (anhydrous basis)/min./liter bath solution, preferably at a rate of from about 0.05 to about 0.07 g $H_2O_2$ (anhydrous basis)/min./liter bath solution.

The concentration of the hydrogen peroxide to be added to the bath solution is preferably between 25–35% wt., more preferably about 30–31% wt. When using such diluted hydrogen peroxide as the added hydrogen peroxide material, it is preferred to add from about 0.05 to about 5 ml $H_2O_2$/min./liter bath solution, preferably at a rate of from about 0.15 to about 2.1 ml $H_2O_2$/min./liter bath solution.

Typical volumes for bath solutions range from about 10–100 liters, commonly 10–60 liters. As a practical example, a conventional photoresist bath contains about 20 liters of bath solution, and the rate of addition of hydrogen peroxide to such a bath size would be from about 1 to about 100 ml $H_2O_2$ (30–31% wt.)/min., preferably from about 3 to about 45 ml $H_2O_2$ (30–31% wt.)/min.

The hydrogen peroxide can be added to the bath solution in either a continuous or intermittent fashion. The continuous addition mode is preferred, although the intermittent mode may be used to simulate the continuous mode. In a preferred embodiment, a continuous flow of hydrogen peroxide is added to the sulfuric acid by means of controlling the hydrogen peroxide pressure and using a needle valve to control the hydrogen peroxide flow. Alternatively, the hydrogen peroxide can be added to the bath solution by means of a piston injection pump where the stroke and volume of the piston are adjusted to provide the desired rate of hydrogen peroxide addition. In another embodiment, timed spikes of a predetermined amount of hydrogen peroxide are used as the way to introduce the hydrogen peroxide. For instance, timed additions of hydrogen peroxide could be made every 5, 10, 30, 60, etc. seconds to the bath solution.

In one embodiment, the process can be started by preparing an initial sulfuric acid bath. Into this sulfuric acid bath would be added the semiconductor wafers with the initiation of the introduction of the hydrogen peroxide at the controlled rate. In another embodiment, a small quantity of hydrogen peroxide is added to the sulfuric acid in the bath solution prior to the introduction of any semiconductor wafers.

This controlled rate of hydrogen peroxide addition supplies a sufficient quantity of hyrogen peroxide to the bath solution to create an effective quantity of Caro's acid to fully oxidize any photoresist material on the surfaces of the semiconductor wafers. For a conventional 20 liter bath solution, the effective life of the bath solution is projected to be at least 15, preferably at least 17, and more preferably more than 20 hours using the processing technique of the present invention. The process of the present invention is superior to a technique whereby the entire quantity of hydrogen peroxide necessary to operate the stripping bath for an equivalent period of time is added at the beginning of the processing because a far smaller quantity of hydrogen peroxide is required in accordance with the present invention than in the latter technique due to the more efficient conversion of hydrogen peroxide in the present invention. In the conventional processes, where the bulk of the hydrogen peroxide is initially added to the processing bath, typical lifetimes are on the order of 8 hours.

The wafers are cleaned by the contact with the bath solution and the contacting step is discontinued with the wafers being subsequently processed further in accordance with standard practices prior to use. The stripping or cleaning bath solution is then ready to process the next batch of semiconductor wafers. The addition of the hydrogen peroxide to the bath solution at the stated rate is normally maintained during the life of the bath solution.

The initiation of the controlled addition rate of hydrogen peroxide need not necessarily begin at the beginning of the wafer processing if there is enough hydrogen peroxide present in the initial bath solution. However, in accordance with the present invention, at some point during the processing of subsequent batches of wafers, the controlled addition rate of hydrogen peroxide is initiated and continued throughout the subsequent processing of semiconductor wafers.

One can understand the efficiency of such a process in the following way: if one cleans post-ash photoresist layers with pure sulfuric acid, the whole solution will turn black. However, when one droplet of hydrogen peroxide is added to the solution or if ozone is bubbled for a few minutes, the whole bath will become clear almost instantly.

The main advantage of the process of the present invention relates to capital cost savings, since the ozone generator can now be replaced by an inexpensive injection system for hydrogen peroxide that is fed from the bulk supply of the fab. Compared to the traditional 4:1 sulfuric acid/hydrogen peroxide solution, such a system would offer substantial advantages. Following the example set forth above, since only 3.97 ml/min of hydrogen peroxide are injected into the sulfuric acid, excessive heat and water will not be added to the mixture and Caro's acid production should be optimized. In other words, this method of slowly adding hydrogen peroxide to sulfuric acid should convert significantly more hydrogen peroxide into "Caro's acid" than the conventional 4:1 solution. An additional complication however is the steady increase of volume which has to be taken into account, when engineering the system.

After injection of hydrogen peroxide solution (about 31%-w) at 3.97 ml/min for 17 hours, then 4.05 l of hydrogen peroxide would have been injected into the 20 l bath, and the whole solution will have a ratio of 3.9:1 sulfuric acid to hydrogen peroxide, which is very close to the conventional 4:1 solution. Therefore, after 17 hours, the whole solution should be thrown out and a new batch started. The solution would last for more than 2 shifts or about 20 batches of processing.

In the FIGURE a conceptual comparison is made between the 3 different Piranha baths in terms of active peroxysulfuric species as a function of time. The graph is shown over a period of 4 days and the following assumptions are made:

1) In the case of the low rate $H_2O_2$ injection system: an injection rate of 3.97 ml/min for $H_2O_2$ with a bath changeover after 17 hours. Furthermore, a 100% conversion efficiency of $H_2O_2$ into $H_2SO_5$ and no decrease in concentration due to instability of the $H_2SO_5$ is assumed.

2) In the case of the ozone injection system: an injection rate of 1.74 g $O_3$/min with a bath lifetime of 4 days. Furthermore, a 100% conversion efficiency of $O_3$ into $H_2S_2O_8$ and no decrease in concentration due to instability of the $H_2S_2O_8$ is assumed.

3) In the case of the conventional 4:1 solution: a bath lifetime of 8 hours. A 80% conversion efficiency of $H_2O_2$ into $H_2SO_5$ is simulated in this case to reflect the loss of conversion efficiency of $H_2O_2$ into $H_2SO_5$ due to the heat and the excess of water. We have also simulated a rapid decrease in active peroxysulfuric acid due to high temperature and high water concentration.

Obviously these assumptions only take into account the loss of peroxysulfuric acid in the conventional 4:1 solution, whereas there is no simulation for the loss of peroxysulfuric acid in the other 2 cases. This will give too optimistic result for the case of the ozone/sulfuric and the low rate $H_2O_2$ injection case. However, we can see some trends from this figure immediately. Initially, the conventional 4:1 solution will contain the highest amount of oxidizers, but over longer periods of time, it is clear that, when there is no appreciable organic load (e.g. for cleaning or post-ash resist stripping) that the loss of peroxysulfuric acid is more important than the low injection rates of oxidizer. If the loss of peroxysulfuric acid can be reduced and if there is no appreciable organic load, the low injection rate systems will yield a much higher peroxysulfuric acid concentration.

Instead of mixing the chemicals sulfuric acid/hydrogen peroxide in a 4:1 dilution ratio, the present invention comprises the gradual addition of peroxide to sulfuric acid until some ratio such a 4:1 is reached at which time the bath will most likely be ready to exchange for a fresh bath.

An optimized system for cleaning with sulfuric/hydrogen peroxide would continuously add small amounts of $H_2O_2$ to sulfuric acid. For example, in a typical process, 3.97 ml/min of hydrogen peroxide (31% by weight), can be added continuously to concentrated sulfuric acid.

After injection of hydrogen peroxide solution (31%-w) at 3.97 ml/min for 17 hours, then 4.05 l of hydrogen peroxide would have been injected into the 20 l bath, and the whole solution will have a ratio of 3.9:1 sulfuric acid to hydrogen peroxide which is very close to the conventional 4:1 solution. Therefore, after 17 hours, the whole solution should be thrown out and a new batch started. The solution would last for more than 2 shifts or about 20 batches of processing. The new invention states that the total amount of hydrogen peroxide can be added in portions or continuously and from the start that the first hydrogen peroxide is added or from the start of the continuous adding of hydrogen peroxide, that wafers can be processed. The total amount of hydrogen peroxide is divided into equal portions and added in series while the solution is being used to process wafers.

Much lower concentrations are added than conventionally used. E.g., the sum of the added hydrogen peroxide portions will generally not exceed 4 liter of hydrogen peroxide solution for a total bath volume of 20 l and typically the portions will be of the order of 1 to 20 ml/min.

The replacement of hydrogen peroxide with ozone in sulfuric acid for resist stripping permits superior process control, longer solution life and reduced consumable expenses. Capital cost, however, is increased and performance of un-ashed wafers may be insufficient. Since most applications of wet photoresist stripping are today limited to ashed wafers, this is not a real concern.

As an alternative for the ozone injection, low rate injection of hydrogen peroxide can be used to strip ashed photoresist. Such a low rate injection of hydrogen peroxide will offer more efficient use of hydrogen peroxide as compared to the traditional 4:1 solution and decreased capital cost as compared to the sulfuric/ozone system, but at the expense of increased consumables cost, both in $H_2O_2$ and in $H_2SO_4$. It has been calculated that we can keep the sulfuric/ $O_3$ chemicals for at least 4 days, whereas the sulfuric/ peroxide with low rate injection of hydrogen peroxide should be replaced every 17 hours.

What is claimed is:

1. A method for stripping ashed photoresist material from an exposed surface of a semiconductor wafer comprising:
   (a) preparing an initial bath solution consisting essentially of sulfuric acid ($H_2SO_4$);
   (b) adding hydrogen peroxide ($H_2O_2$) to the initial bath solution to produce a processing bath solution, the rate of addition of the hydrogen peroxide being from about 0.015 to about 1.5 g $H_2O_2$ (anhydrous basis)/min./liter of the processing bath solution;
   (c) processing the semiconductor wafers through the processing bath solution by contacting the surfaces of the semiconductor wafers with the processing bath solution and removing ashed photoresist material from the semiconductor wafers, wherein the processing bath solution has a temperature of about 90° C. during the processing of the semiconductor wafers; and
   (d) maintaining the rate of hydrogen peroxide addition during the processing of the semiconductor wafers.

2. The method of claim 1 where the rate of addition of the hydrogen peroxide is from about 0.05 to about 0.7 g $H_2O_2$ (anhydrous basis)/min./liter of the processing bath solution.

3. A method for stripping ashed photoresist material from an exposed surface of a semiconductor wafer comprising:
   (a) providing an initial bath solution comprising sulfuric acid ($H_2SO_4$) and hydrogen peroxide ($H_2O_2$), where the ratio of sulfuric acid to hydrogen peroxide used to prepare the initial bath solution is greater than 15:0.3, referring to volume quantities of the anhydrous chemical substances;
   (b) adding hydrogen peroxide to the initial bath solution to produce a processing bath solution, the rate of addition of the hydrogen peroxide being from about 0.015 to about 1.5 g $H_2O_2$ (anhydrous basis)/min./liter of the processing bath solution;
   (c) processing semiconductor wafers through the processing bath solution by contacting the surfaces of the semiconductor wafers with the processing bath solution and removing ashed photoresist material from the semiconductor wafers, wherein the processing bath solution has a temperature of about 90° C. during the processing of the semiconductor wafers; and
   (d) maintaining the rate of hydrogen peroxide addition during the processing of the semiconductor wafers.

4. The method of claim 3 wherein the ratio of sulfuric acid to hydrogen peroxide in the initial bath solution is greater than 20:0.3, referring to volume quantities of the anhydrous chemical substances.

5. The method of claim 3 where the rate of addition of the hydrogen peroxide is from about 0.05 to about 0.7 g $H_2O_2$ (anhydrous basis)/min./liter of the processing bath solution.

6. A method for stripping ashed photoresist material from an exposed surface of a semiconductor wafer comprising:
   (a) preparing an initial bath solution by adding concentrated sulfuric acid ($H_2SO_4$), being at least 95% by weight sulfuric acid, with dilute hydrogen peroxide ($H_2O_2$), being between about 25–35% by weight hydrogen peroxide, where the ratio of sulfuric acid to hydrogen peroxide used to prepare the initial bath solution is greater than 15:0.3, referring to volume quantities of the anhydrous chemical substances;
   (b) adding dilute hydrogen peroxide, being between 25–35% by weight hydrogen peroxide, to the initial bath solution to create a processing bath solution, the rate of addition of the hydrogen peroxide being from about 0.05 to about 5 ml $H_2O_2$/min./liter of the processing bath solution;
   (c) processing semiconductor wafers through the processing bath solution by contacting the surfaces of the semiconductor wafers with the processing bath solution and removing ashed photoresist material from the semiconductor wafers, wherein the processing bath solution has a temperature of about 90° C. during the processing of the semiconductor wafers; and
   (d) maintaining the rate of hydrogen peroxide addition during the processing of the semiconductor wafers.

7. The method of claim 6 wherein the ratio of sulfuric acid to hydrogen peroxide used to prepare the initial bath solution prior to the processing of the semiconductor wafers is greater than 20:0.3, referring to volume quantities of the anhydrous chemical substances.

8. The method of claim 6 wherein the rate of addition of the hydrogen peroxide is from about 0.15 to about 2.1 ml $H_2O_2$/min./liter of the processing bath solution.

9. A method for stripping photoresist material from an exposed surface of a semiconductor wafer or for cleaning an exposed surface of semiconductor wafers in general, comprising:
   (a) preparing an initial bath solution consisting essentially of sulfuric acid ($H_2SO_4$);
   (b) processing a first batch of semiconductor wafers within the initial bath solution by contacting the surfaces of the semiconductor wafers with the initial bath solution;
   (c) adding hydrogen peroxide ($H_2O_2$) to the initial bath solution, during the processing of the first batch of semiconductor wafers, to produce a processing bath solution, the rate of addition of the hydrogen peroxide being from about 0.015 to about 1.5 g $H_2O_2$ (anhydrous basis)/min./liter of the processing bath solution;
   (d) processing subsequent batches of semiconductor wafers within the processing bath solution by contacting the surfaces of the semiconductor wafers with the processing bath solution; and
   (e) maintaining the rate of hydrogen peroxide addition to the processing bath solution during the processing of the subsequent batches of semiconductor wafers.

10. The method of claim 9 wherein the rate of addition of the hydrogen peroxide is from about 0.05 to about 0.7 g $H_2O_2$ (anhydrous basis)/min./liter of the processing bath solution.

11. A method for stripping ashed photoresist material from an exposed surface of a semiconductor wafer comprising:
   (a) providing an initial bath solution comprising sulfuric acid ($H_2SO_4$) and hydrogen peroxide ($H_2O_2$), where the ratio of sulfuric acid to hydrogen peroxide used to prepare the initial bath solution is greater than 15:0.3, referring to volume quantities of the anhydrous chemical substances;
   (b) processing a first batch of semiconductor wafers within the initial bath solution by contacting the surfaces of the semiconductor wafers with the initial bath solution and removing ashed photoresist material from the semiconductor wafers, wherein the initial bath solution has a temperature of about 90° C. during the processing of the first batch of semiconductor wafers;

(c) adding hydrogen peroxide to the initial bath solution, during the processing of the first batch of semiconductor wafers, to produce a processing bath solution, the rate of addition of the hydrogen peroxide being from about 0.015 to about 1.5 g $H_2O_2$ (anhydrous basis)/min./liter of the processing bath solution;

(d) processing subsequent batches of semiconductor wafers within the processing bath solution by contacting the surfaces of the semiconductor wafers with the processing bath solution and removing ashed photoresist material from the semiconductor wafers, wherein the processing bath solution has a temperature of about 90° C. during the processing of the subsequent batches of semiconductor wafers; and (e) maintaining the rate of hydrogen peroxide addition to the processing bath solution during the processing of the subsequent batches of semiconductor wafers.

12. The method of claim 11 wherein the rate of addition of the hydrogen peroxide is from about 0.05 to about 0.7 g $H_2O_2$ (anhydrous basis)/min./liter of the processing bath solution.

13. The method of claim 3 further comprising feeding ozone into the processing bath solution during the processing of the semiconductor wafers.

14. The method of claim 1 further comprising feeding ozone into the processing bath solution during processing of the semiconductor wafers.

* * * * *